United States Patent [19]

Tsurushima

[11] 3,828,267

[45] Aug. 6, 1974

[54] MUTING CIRCUIT

[75] Inventor: Katsuaki Tsurushima, Yokohama, Japan

[73] Assignee: Sony Corporation, Tokyo, Japan

[22] Filed: May 15, 1973

[21] Appl. No.: 360,460

[30] Foreign Application Priority Data

May 27, 1972 Japan .............................. 47-62497

[52] U.S. Cl. .................... 330/29, 330/30 R, 330/51, 330/124 R

[51] Int. Cl. .............................................. H03g 3/30

[58] Field of Search .......... 330/29, 51, 30 R, 124 R, 330/145; 325/402, 403; 179/1 A, 1 P, 15 BL

[56] References Cited

UNITED STATES PATENTS 3,375,446 3/1968 Guyton ........................... 325/403 X

*Primary Examiner*—Herman Karl Saalbach
*Assistant Examiner*—James B. Mullins
*Attorney, Agent, or Firm*—Lewis H. Eslinger, Esq.; Alvin Sinderbrand, Esq.

[57] ABSTRACT

A voltage dividing circuit including first and second transistors connected in series is connected between a first output terminal of one polarity of a bridge rectifier circuit and a second output terminal of the opposite polarity of a voltage regulator connected to the bridge rectifier circuit. A first time constant circuit is connected between the base of a first one of the transistors and the first output terminal and a second time constant circuit is connected between the base electrode of the second transistor and the circuit ground. A muting transistor is connected in shunt with the signal transmission line and its base is connected between the first output terminal and the first transistor. When power is applied to the circuit by the closing of a power switch the first transistor is initially made non-conductive during a predetermined period by the operation of the first time constant circuit so that the base electrode of the muting transistor is supplied with a muting signal to make it conductive and thereby mute signals on the transmission line. When power to the circuit is interrupted, as by the opening of the power switch, the second transistor is made non-conductive by the second time constant circuit for a predetermined time so that power stored in the voltage regulating circuit is supplied to the base electrode of the muting transistor to thereby again mute signals on the transmission line.

11 Claims, 3 Drawing Figures

MUTING CIRCUIT

BACKGROUND OF THE INVENTION

The present invention relates generally to muting circuits and more particularly to a muting circuit for use with an audio amplifier to eliminate extraneous sounds produced when power to the audio amplifier is supplied or interrupted.

In an amplifier for use with an audio system, at the time when electric power is initially supplied to the amplifier, as for example upon the closing of a power switch, a clicking noise appears transiently in the output of the amplifier due to the rising up of the power source voltage. Conversely, when power to the audio amplifier is turned off, as by the opening of the power switch, a clicking noise again appears transiently in the output of the amplifier due to the decaying power source voltage.

In order to mute such extraneous noises it has been proposed to provide a switch in ganged relation with the power switch so that when the power switch is closed the muting switch is operated in a manner such as to cut-off the output of the amplifier, for example, to ground the output of the amplifier. One disadvantage of some such prior art methods is that they do not work equally well when the power switch is either turned on or turned off. Still another disadvantage of such prior art methods is that the extraneous noises are still produced when the power is interrupted from some other source than a power switch, such as when the power cord is removed from a wall socket or the equipment is operated by still another power switch such as in conjunction with an automatic record changer.

In still another prior art method to accomplish the same purpose a silicon controlled rectifier (SCR) is connected between the power source and the amplifier. With this circuit immediately after the closing of the power switch a low operating voltage is supplied to the amplifier through the SCR under the control of time constant circuits. After a predetermined time interval the SCR is triggered to supply a normal operating voltage to the amplifier. When the power switch is opened, the SCR is immediately turned off to stop the operation of the amplifier. This circuit has a disadvantage that during the turning off operation the extraneous noise may still appear.

SUMMARY OF THE INVENTION

The above and other disadvantages are overcome by the present invention of a muting circuit for use with a power supply having output terminals and a transmission path for transmitting signals, the muting circuit comprising a muting element having a control terminal and connected to the signal transmission path to interrupt the flow of signals, first and second switching elements connected in series with each other and between the terminals of the power source, first circuit means connected to the first switching element for causing it to become non-conductive during a predetermined time in response to the application of power from an external source to the power supply and second circuit means connected to the second switching element for causing it to become non-conductive in response to the interruption of power from the external power source to the power supply. Means are also connected between the first switching element and the control terminal of the muting element so that the muting element is caused to interrupt the flow of signals in the signal transmission path when either one of the first and second switching elements is made non-conductive.

It is therefore an object of the invention to provide a novel muting circuit which mutes extraneous noises at the output terminal of an audio amplifier caused by the application or interruption of power to the audio amplifier.

It is another object of the invention to provide a muting circuit for use with a multi-channel audio amplifier.

The foregoing and other objectives, features, and advantages of the invention will be more readily understood upon consideration of the following detailed description of certain preferred embodiments of the invention, taken in conjunction with the accompanying drawings.

DESCRIPTION OF THE PREFERRED EMBODIMENTS

Figure 1:
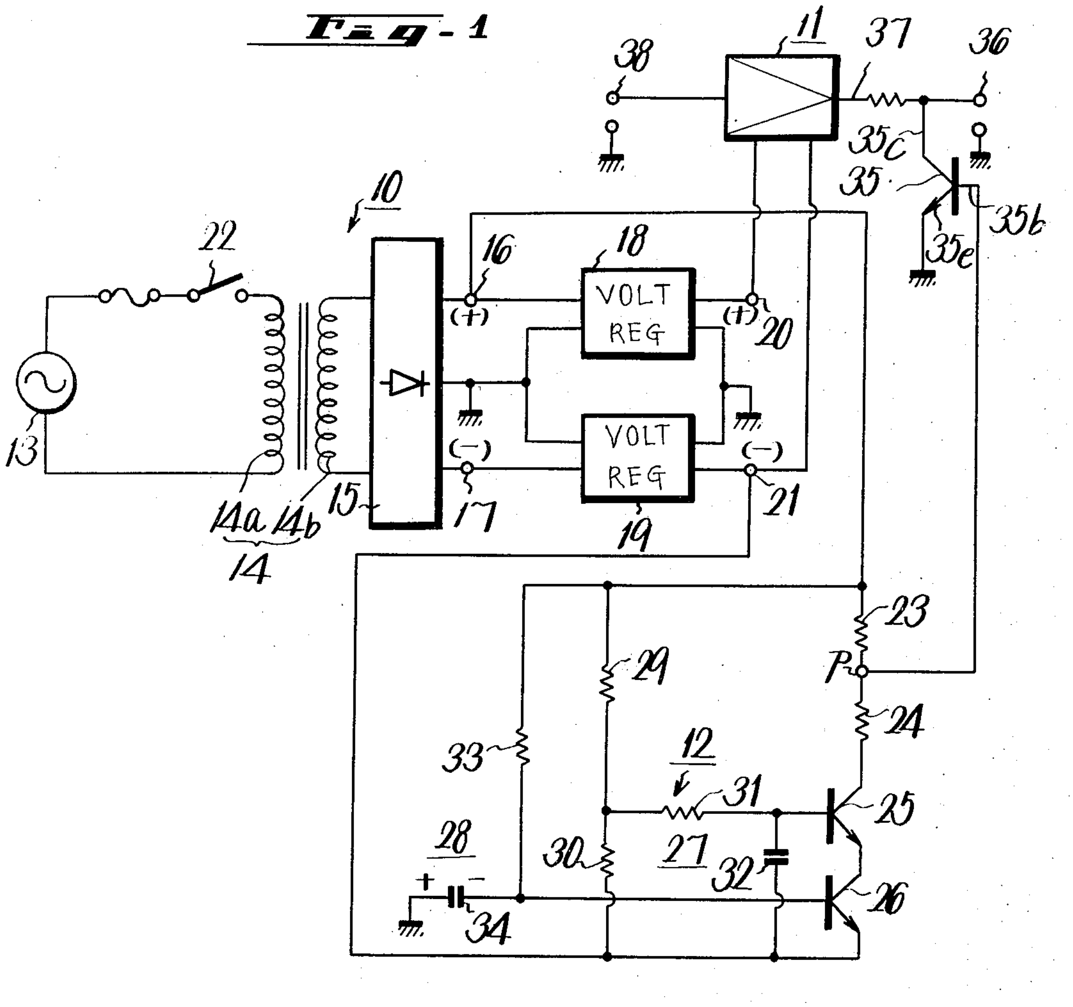
FIG. 1 is a schematic diagram of a muting circuit for use with an audio amplifier according to a first embodiment of the invention.

Referring now more particularly to FIG. 1 reference numeral 10 designates a DC power supply which includes a transformer 14 having a primary winding 14*a* connected in series with a switch 22 to an external AC power source 13 and a secondary winding 14*b* connected to the input of a full wave rectifier 15. The rectifier 15 produces positive and negative DC voltages (with respect to the circuit ground) at its output terminals 16 and 17, respectively. A first voltage regulator 18 is connected between the terminal 16 and the circuit ground and has an output terminal 20 which supplies a regulated positive voltage to one lead of an audio amplifier 11. A second voltage regulator is connected between the terminal 17 and the circuit ground and produces a regulated negative voltage output at a terminal 21 which is supplied to another lead of the audio amplifier 11. A detailed description of the circuit construction of the power supply 10 will be omitted since such circuits are well known in the art, but it is to be understood that the positive and negative DC voltages delivered to the terminals 16 and 17, respectively, increases to their predetermined potential more rapidly than the corresonding voltages appearing at the output terminals 20 and 21 due to the filtering circuits within the voltage regulators 18 and 19.

A muting signal circuit, generally designated 12 is connected between the terminal 16 and the terminal 21. The muting circuit 12 is comprised of a resistor 23 connected at one lead to the terminal 16 and at its other lead to a point P and one lead of a resistor 24. The other lead of the resistor 24 is connected to the collector of a NPN transistor 25 whose emitter is connected to the collector of an NPN transistor 26. The emitter electrode of the transistor 26 is connected directly to the terminal 21. A resistor 29 is connected from the terminal 16 in series with a resistor 30 to the terminal 21.

The junction of the resistors 29 and 30 is connected through a resistor 31 to the base electrode of the transistor 25. A capacitor 32 is connected between the base electrode of the transistor 25 and the terminal 21. Together the resistors 29, 30 and 31 and the capacitor 32 constitute a first time constant circuit 27. As will be explained in greater detail hereinafter the circuit 27 ensures that the transistor 25 remains nonconductive for a predetermined period after the switch 22 is closed.

The base electrode of the transistor 26 is connected to the terminal 16 through a resistor 33 and to the circuit ground through a capacitor 34. Together the resistor 33 and the capacitor 34 constitute a second time constant circuit 28 which, as will be explained in greater detail hereinafter, ensures that the transistor 26 becomes immediately non-conductive when the switch 22 is opened.

The point P is connected to the base electrode **35*b* of an NPN transistor 35 whose emitter electrode 35*e* is connected to the circuit ground and whose collector electrode 35*c* is connected to an output terminal 36. The output terminal 36 is connected through a signal transmission line 37 to the output of the amplifier 11. The input to the amplifier 11 is supplied at the terminal 38**.

In operation, when the power switch 22 is closed an AC voltage is supplied through the secondary winding **14*b* to the rectifier 15 to produce positive and negative DC voltages at the terminals 16 and 17, respectively. These positive and negative DC voltages are regulated by the voltage regulators 18 and 19 to supply corresponding regulated voltages at the output terminals 20 and 21, respectively. The positive DC voltage delivered at terminal 16 causes current to flow through the resistors 29 and 31 to charge the capacitor 32**.

Since the voltage across the capacitor 32 increases gradually in accordance with the time constant determined by the resistance of the resistor 31 and the capacitance of the capacitor 32 the base electrode of the transistor 25 is not immediately supplied with a voltage sufficient to make the transistor 25 conductive so that the transistor 25 is kept in its non-conductive state for a predetermined time after the closing of the switch 22. The emitter potential of the transistor 26 is eventually made negative by the DC voltage derived at the terminal 21 so that the transistor 26, which is supplied with a positive base bias voltage derived from the terminal 16, is made conductive. When the transistor 26 becomes conductive, however, its base potential is only slightly less negative than the voltage derived at the terminal 21 and thus the capacitor 34 is charged with a negative voltage with respect to the circuit ground.

During the time that the transistor 25 is nonconductive the voltage from the terminal 16 is supplied substantially directly to the base electrode **35*b* of the muting transistor 35 so that the transistor 35 is made conductive. When the transistor 35 is conductive it provides a shunt path to the circuit ground for the extraneous signal generated in the amplifier 11 by the closing of the switch 22. The extraneous signal thus does not appear at the terminal 36. The time interval from the closing of the power switch 22 to the time when the muting transistor 35 is made conductive in the manner described above can be selected to be smaller than, for example, 1 milli-second due to the fact that the rise time of the voltage at the terminal 16 is extremely rapid as compared with the voltages derived at the terminals 20 and 21**.

After the capacitor 32 has charged to its full value the transistor 25 is made conductive. This time may be, for example, about 3 to 4 seconds. When the transistor 25 is conductive the resistors 23 and 24 constitute a voltage dividing network between the positive and negative terminals 16 and 21, respectively. The value of the resistors 23 and 24 are selected such that the point P then becomes a source of negative potential so that the transistor 35 is made non-conductive. When the transistor 35 is non-conductive an input signal applied to the terminal 38 is amplified by the amplifier 11 and delivered unchanged to the output terminal 36 through the transmission line 37. In order to avoid the situation that the junction between the collector-emitter electrodes of the transistor 35 will act as a zener diode the negative potential of the point P is selected such that the base-emitter junction of the transistor 35 is sufficiently reversed biased that the amplified output from the amplifier 11 is not clipped even during negative half cycles of the output signal.

When the power switch 22 is opened to interrupt the flow of power from the source 13, the potential at the terminal 21, and thus the potential at the emitter of the transistor 26, increases rapidly to a zero voltage from the predetermined negative voltage. However, since the base potential of the transistor 26 is clamped at a predetermined negative potential by the voltage stored in the capacitor 34, the transistor 26 is thereby made nonconductive. Thus even if the transistor 25 remains conductive, since the transistor 26 is non-conductive a part of the voltage stored in the capacitor 32, or a voltage stored in a capacitor (not shown) of the power supply circuit 10, is applied to the connection point P and thus to the base electrode of the transistor **35*b* of the muting transistor to turn it on. Thus extraneous noise which is produced by the opening of the power switch 22 is also shunted to the circuit ground through the muting transistor 35. This muting operation is maintained until the voltage at the terminal 16** is lowered to cause the operation of the whole circuit to cease.

Although the operation of the above-described embodiment has been made with respect to the opening and closing of switch 22 it will be recognized by those skilled in the art that the operation takes place in substantially the same manner with any interruption of the power supplied from the external source 13, as for example, by unplugging the utility cord connecting the circuit to the external source 13.

Figure 2:
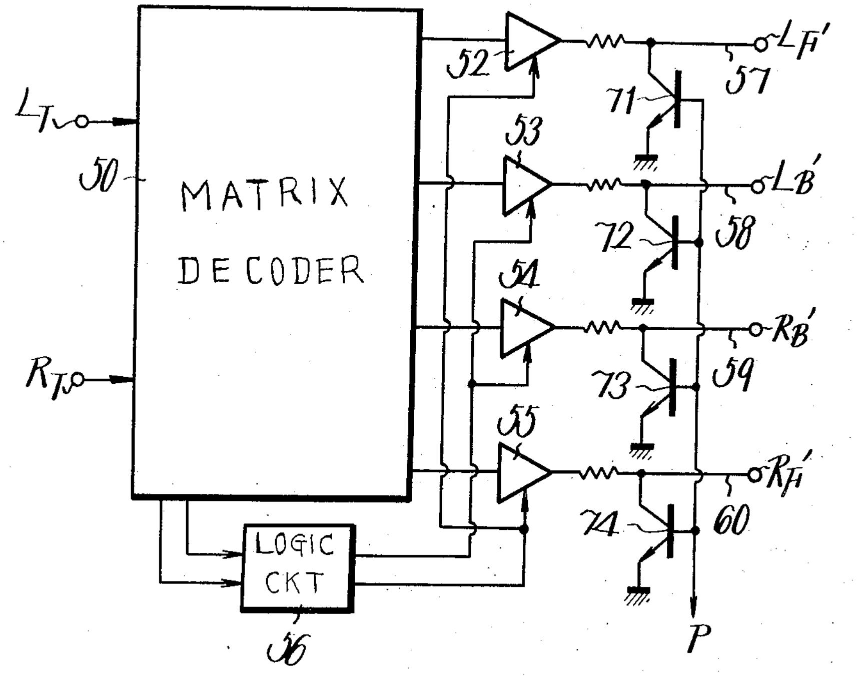
FIG. 2 is a schematic diagram of the application of the embodiment of FIG. 1 to a multi-channel audio amplifier.

Referring now more particularly to FIG. 2 a four channel stero system applying the muting circuit of the embodiment of FIG. 1 is illustrated. In this circuit, as is well known in the art, two composite signals $L_T$ and $R_T$ are supplied to a decoder 50 and four decoded signals $L_F'$, $L_B'$, $R_B'$ and $R_F'$ are derived therefrom through four gain controlled amplifiers 52, 53, 54 and 55, respectively. The signals obtained by the decoder 50 are further fed to a logic circuit 56 which supplies gain control signals to the amplifiers 52–55.

In some embodiments such gain controlled amplifiers are of the feedback type so that when the electric power source 13 is connected to or disconnected from the system the amplifiers produce amplified pulses at their outputs which are audible as noise.

The outputs from the amplifiers 52, 53, 54 and 55 are separately supplied to the transmission lines 57, 58, 59 and 60, respectively. Separate NPN muting transistors 71, 72, 73 and 74 are each connected with their collector-emitter junctions between the transmission lines 57–60, respectively, and the circuit ground. The bases of the transistors 71–74, inclusive, are connected to the point P of the circuit of FIG. 1. Thus the muting transistors 71–74 simultaneously operate in substantially the same manner as the transistor 35 of the embodiment of FIG. 1 under the control of a single muting signal.

Figure 3:
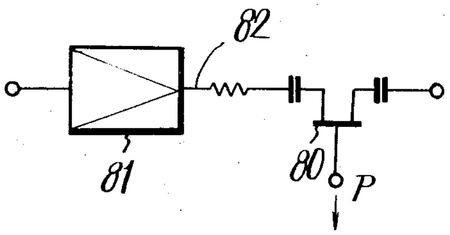
FIG. 3 is a schematic diagram of a modified embodiment of the invention in which a field effect transistor is used as a muting element.

Referring now more particularly to FIG. 3 a field effect transistor (FET) 80 is employed as a muting element. In this circuit the FET 80 is connected in series with the signal transmission line 82 connected to the output of the amplifier 81. When a signal is supplied to the terminal P the transistor 80 becomes non-conductive thereby blocking the transmission of the signal along the transmission line 82. The gate electrode of the transistor 80 is connected to the point P in the circuit of the embodiment of FIG. 1 and otherwise operates in substantially the same manner.

The terms and expressions which have been employed here are used as terms of description and not of limitation, and there is no intention in the use of such terms and expressions, of excluding equivalents of the features shown and described, or portions thereof, it being recognized that various modifications are possible within the scope of the invention claimed.

What is claimed is:

1. A muting circuit for use with a signal transmission path and a power supply, the muting circuit comprising:

a. a muting element connected to the signal transmission means;

b. a muting signal producing circuit including first and second switching elements connected in series with each other and connected across an output from the power supply and circuit means connected between the power supply and the first and second switching elements for producing a first muting signal after a predetermined period in response to the application of power from an external source to the power supply and a second muting signal in response to the interruption of power to the power supply, respectively; and c. means connected between the muting signal producing circuit and the muting element for supplying the first and second muting signals to the muting element.

2. In a muting circuit for use with a power supply having output terminals, a signal transmission means for transmitting signals and a muting element having a control terminal and connected to the signal transmission means, a muting signal producing circuit comprising:

a. first and second transistors connected in series with each other and to the output terminals of the power source;

b. first circuit means connected to the first transistor for causing the first transistor to be non-conductive during a predetermined time period in response to the application of power from an external source to the power supply;

c. second circuit means connected to the second transistor for causing the second transistor to be non-conductive in response to the interruption of power to the power supply; and d. means connected between the first transistor and the control terminal of the muting element.

3. A muting circuit as recited in claim 2 wherein the first and second circuit means are time constant circuits, each including a capacitor.

4. A muting circuit as recited in claim 2 wherein the muting element is connected between the signal transmission means and the circuit ground.

5. A muting circuit as recited in claim 2 wherein the signal transmission means includes an amplifier which is supplied with DC voltage from the power source.

6. A muting circuit as recited in claim 2 wherein the muting element is a field effect transistor connected in series with the signal transmission means.

7. A muting circuit for use with a signal transmission path and a DC power supply of the type having a circuit ground, a first terminal for supplying a voltage of one polarity and a second terminal for supplying a voltage of the opposite polarity a predetermined time after the application of power from the external source to the power supply, the muting circuit comprising a first switching element connected to the signal transmission path to selectively interrupt the passage of signals through the transmission path, second and third switching elements connected in series between the first and second power supply terminals, first means connected to the first power supply terminal for causing the second switching element to change from a non-conductive to a conductive state a predetermined time after the voltage of one polarity is initially supplied, second means connected to the second power supply terminal and the circuit ground for causing the third switching element to change from a conductive to a non-conductive state when the voltage of the opposite polarity ceases, and means connected between the first power supply terminal and the second switching element for causing the first switching element to interrupt the passage of signals through the transmission path when either of the second and third switching elements is non-conductive.

8. A muting circuit as recited in claim 7 wherein the first, second and third switching elements are transistors.

9. A muting circuit as recited in claim 8 wherein the first means includes a resistor connected between the base electrode of the second switching element transistor and the first power supply terminal and a capacitor connected between the base electrode of the second switching element transistor and the second power supply terminal.

10. A muting circuit as recited in claim 8 wherein the second means includes a resistor connected between the base electrode of the third switching element transistor and the first power supply terminal and a capacitor connected between the base electrode of the third switching element transistor and the circuit ground.

11. A muting circuit as recited in claim 7 further comprising a plurality of transmission paths and a plurality of muting elements corresponding to the first switching element, each muting element being connected to a separage transmission path but controlled simultaneously with the first switching element.

* * * * *